United States Patent
Luo et al.

(10) Patent No.: US 8,614,592 B1
(45) Date of Patent: *Dec. 24, 2013

(54) HIGH DATA RATE ENVELOPE DETECTOR FOR HIGH SPEED OPTICAL STORAGE APPLICATION

(75) Inventors: Qiang Luo, Milpitas, CA (US); Yingxuan Li, Cupertino, CA (US); Sriharsha Annadore, Sunnyvale, CA (US); Pantas Sutardja, Los Gatos, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/764,578

(22) Filed: Apr. 21, 2010

Related U.S. Application Data

(63) Continuation of application No. 11/492,612, filed on Jul. 24, 2006, now Pat. No. 7,737,731.

(60) Provisional application No. 60/728,634, filed on Oct. 20, 2005, provisional application No. 60/816,307, filed on Jun. 22, 2006.

(51) Int. Cl.
*H03K 5/153* (2006.01)

(52) U.S. Cl.
USPC .................................................. 327/58

(58) Field of Classification Search
USPC .................................................. 327/58–62
See application file for complete search history.

(56) References Cited

U.S. PATENT DOCUMENTS

| | | | |
|---|---|---|---|
| 4,459,699 A | 7/1984 | Monticelli et al. | |
| 5,025,176 A * | 6/1991 | Takeno | 327/58 |
| 5,187,448 A | 2/1993 | Brooks et al. | |
| 5,324,994 A | 6/1994 | Sullivan et al. | |
| 5,331,210 A | 7/1994 | McCarroll | |
| 5,355,038 A | 10/1994 | Hui | |
| 5,471,665 A | 11/1995 | Pace et al. | |
| 5,546,027 A * | 8/1996 | Shinozaki et al. | 327/59 |
| 5,828,240 A | 10/1998 | Smith | |
| 5,954,756 A | 9/1999 | Hemming et al. | |
| 6,064,262 A | 5/2000 | Wang | |

(Continued)

FOREIGN PATENT DOCUMENTS

JP 09288132 A * 11/1997

OTHER PUBLICATIONS

Abdalla et al., "An Analog VLSI Low-Power Envelope Periodicity Detector," *IEEE Transactions on Circuits and Systems-I: Regular Papers*, vol. 52, No. 9, Sep. 2005, pp. 1709-1720.

(Continued)

*Primary Examiner* — Quan Tra

(57) ABSTRACT

To detect the peaks level of an incoming signal, the difference between the voltage level of the incoming signal and a voltage developed across a capacitor is amplified. The amplified difference signal is applied to a transconductor adapted to vary its output current in response to changes in the amplified difference signal. The variations in the current generated by the transconductor are used to change a current flowing through a current mirror that charges the capacitor. The voltage developed across the capacitor represents the detected peak. The capacitor is discharged to a predefined voltage level during the reset periods. A second amplifier receiving the capacitor voltage is optionally used to develop a voltage across a second capacitor that is not reset and thus carries only the detected peak levels.

19 Claims, 9 Drawing Sheets

(56) References Cited

U.S. PATENT DOCUMENTS

| | | | |
|---|---|---|---|
| 6,081,558 | A | 6/2000 | North |
| 6,252,458 | B1 | 6/2001 | Shibata |
| 6,462,618 | B2 * | 10/2002 | Minegishi ............... 330/252 |
| 6,542,009 | B2 * | 4/2003 | Maruyama ............... 327/59 |
| 6,671,075 | B1 * | 12/2003 | Mizunaga ............... 398/202 |
| 6,791,400 | B2 | 9/2004 | Lou |
| 6,956,905 | B1 | 10/2005 | Rokhsaz |
| 6,963,237 | B2 | 11/2005 | Tamura et al. |
| 7,053,674 | B1 * | 5/2006 | Romero et al. ............ 327/94 |
| 7,095,256 | B1 | 8/2006 | Zhak et al. |
| 7,126,384 | B2 * | 10/2006 | Hsu et al. ............... 327/58 |
| 7,288,990 | B2 | 10/2007 | Ranganathan |
| 7,310,058 | B2 * | 12/2007 | Udupa et al. ............ 341/161 |
| 7,310,077 | B2 | 12/2007 | Kane |
| 7,525,347 | B1 | 4/2009 | Luo |
| 7,525,374 | B2 | 4/2009 | Robert et al. |
| 7,737,731 | B1 | 6/2010 | Luo et al. |
| 2002/0027227 | A1 | 3/2002 | Kang |
| 2004/0124885 | A1 * | 7/2004 | Hsu et al. ............... 327/58 |
| 2004/0183705 | A1 * | 9/2004 | Colonna et al. ............ 341/122 |
| 2008/0012602 | A1 | 1/2008 | Presti et al. |
| 2008/0136338 | A1 | 6/2008 | Troccoli et al. |
| 2008/0139141 | A1 | 6/2008 | Varghese et al. |

OTHER PUBLICATIONS

De Geronimo et al., "Analog Peak Detector and Derandomizer for High-Rate Spectroscopy," *IEEE Transactions on Nuclear Science*, vol. 49, No. 4, Aug. 2002, 99. 1769-1773

Ericson et al., "A Low-Power, CMOS Peak Detect and Hold Circuit for Nuclear Pulse Spectroscopy," *1994 IEEE Nuclear Science Symposium*, Norfolk, VA, Oct. 31-Nov. 5, 1994.

Meyer, "Low-Power Monolithic RF Peak Detector Analysis," *IEEE Journal of Solid-State.Circuits*, vol. 30, No. 1, Jan. 1995, pp. 65-67.

Nagaraj et al., "A Median Peak Detecting Analog Signal Processor for Hard Disk Drive Servo," *IEEE Journal of Solid-State Circuits*, vol. 30, No. 4, Apr. 1995, pp. 461-470.

Palojarvi et al., "A 250-MHz BiCMOS Receiver Channel With Leading Edge Timing Discriminator for a Pulsed Time-of-Flight Laser Rangefinder," *IEEE Journal of Solid-State Circuits*, vol. 40, No. 6, Jun. 1995, pp. 1341-1349.

Sato et al., "Accurate in Situ Measurement of Peak Noise and Delay Change Induced by Interconnect Coupling," *IEEE Journal of Solid-State Circuits*, vol. 36, No. 10, Oct. 2001, pp. 1587-1591.

Zhak et al., "A Low-Power Wide Dynamic Range Envelope Detector," *IEEE Journal of Solid-State Circuits*, vol. 38, No. 10, Oct. 2003, pp. 1750-1753.

Zhak, Serhii M. et al., "A Low-Power Wide Dynamic Range Envelope Detector", IEEE Journal of Solid-State circuits, vol. 38, No. 10, Oct. 2003.

Abdalla, Hisham et al., "An Analog VLSI Low-Power Envelope Periodicity Detector", IEEE Transactions on Circuits and Systems, vol. 52, No. 9, Sep. 2005.

Ericson, M.N. et al., "A Low-Power, CMOS Peak Detect and Hold Circuit for Nuclear Pulse Spectroscopy", IEEE Nuclear Science Symposium, Norfolk VA, Oct. 31-Nov. 5, 1994.

De Geronimo, Gianluigi, et al., "Analog Peak Detector and Derandomizer for High-Rate Spectroscopy" , IEEE Transactions on Nuclear Science, vol. 49, No. 4, Aug. 2002.

Meyer, Robert G., "Low-Power Monolithic RF Peak Detector Analysis",IEEE Journal of Solid-State Circuits, vol. 30, No. 1, Jan. 1995.

Nagaraj, Krhishnaswamy et al. "A Median Peak Detecting Analog Signal Processor for Hard Disk Drive Servo", IEEE Journal of Solid-State Circuits, vol. 30, No. 4, Apr. 1995.

Palojarvi, Pasi et al. , "A 250-MHz BiCMOS Receiver Channel With Leading Edge Timing Discriminator for a Pulsed Time-of-Flight Laser Rangefinder", IEEE Journal of Solid-State Cicruits, vol. 40. No. 6, Jun. 2005.

Sato, Takashi et al., "Accurate in Situ Measurement of Peak Noise and Delay Change Induced by Interconnect Coupling", IEEE Journal of Solid-State Circuits, vol. 36, No. 10, Oct. 2001.

\* cited by examiner

HIGH DATA RATE ENVELOPE DETECTOR FOR HIGH SPEED OPTICAL STORAGE APPLICATION

CROSS-REFERENCES TO RELATED APPLICATIONS

The present application is a continuation application of commonly-assigned U.S. patent application Ser. No. 11/492,612, filed Jul. 24, 2006, the content of which is hereby incorporated by reference in its entirety, which claims the benefit under 35 USC 119(e) of the following U.S. provisional Applications:

Application No. 60/728,634, filed Oct. 20, 2005, entitled "A High Data Rate Envelope Detector For High Speed Optical Storage Application";

Application No. 60/816,307, filed Jun. 22, 2006, entitled "High Data Rate Envelope Detector For High Speed Optical Storage Application"; the contents of both which are incorporated herein by reference in their entirety.

BACKGROUND OF THE INVENTION

The present invention relates to electronic circuits, and more particularly to detection of peak levels of a voltage signal used in such circuits.

As is known, a peak detector is an analog circuit adapted to detect the peak levels of a signal. A peak detector with a reset capability is commonly referred to as an envelop detector. Envelope detectors are widely used in gain control and spectral energy estimation. Many of the conventional peak detectors or envelope detectors (collectively and alternatively referred to hereinbelow as peak detector) can only operate at low to middle frequency bands, e.g., 1 kHz to 10 kHz, and low to middle data rate applications.

Other conventional peak detectors designed to operate at higher frequencies have a number of shortcomings. Among these shortcomings are relatively high sensitivity to temperature, and fabrication process variations. Furthermore, because such detectors often use MOS transistors that operate in subthreshold regions, their peak detection performance is highly dependent on the waveform of the signal they receive. Accordingly, these detectors also have a relatively high sensitivity to the signal waveform, as described further below.

A conventional high-speed peak detector using MOS transistors operating in subthreshold regions may accurately detect peak level P0 of signal S1, as shown in FIG. 1. However, for a signal that remains unchanged even temporarily after reaching its peak, such as signal S2 shown in FIG. 2, such conventional peak detectors detect a peak level P2 that often overshoots the actual peak level P3. The amount of overshoot ΔP is dependent, in addition to the signal waveform, on the temperature and process variations.

FIG. 4 is a schematic diagram of a peak detector 10, as known in the prior art. Transistors M2 and M3 form a current discharge path that discharge node PV carrying the detected peak voltage. Because this discharge path is slow, peak detector 10 fails to detect some of the peak levels of signal Yin. FIG. 3 shows a typical waveform of signal Yin received by peak detector 10. Because of its slow discharge path, peak detector 10 may only detect peaks P4 and P7 and thus fail to detect peaks P5 and P6. Peak detector 10 is then inoperative in applications such as high-speed optical storage applications, e.g., DVD read/write drivers that require nearly all peaks to be detected. Accordingly, a need continues to exist for a peak detector adapted to operate at relatively high frequencies, and that has a minimized sensitivity to temperature, process and waveform variations.

BRIEF SUMMARY OF THE INVENTION

To detect the peaks level of an incoming signal, the difference between the voltage level of the incoming signal and a voltage developed across a capacitive load is amplified. The amplified difference signal is applied to a transconductor adapted to vary its output current in response to changes in the amplified difference signal. The variations in the current generated by the transconductor is used to change a current flowing through a current mirror that charges the capacitive load. The voltage developed across the capacitive load represents the detected peak. The capacitive load is discharged to a predefined voltage level during the reset periods.

In accordance with one embodiment of the present invention, a peak detector includes, in part, a first amplifier, a transconductor, a capacitive load, and a switching circuit. The amplifier is adapted to amplify the difference between the voltage level of the signal whose peaks are being detected and the voltage level of a node so disposed as to carry the detected peak. The amplified difference is applied to a transconductor which is adapted to vary its output current signal in response to the signals it receives. The current generated by the transconductor causes the capacitive load, which is coupled to the node, to be charged to the value representing the detected peak. The peak detector further includes a current mirror adapted to charge the capacitive load in response to the transconductor output current. The switching circuit is responsive to a reset signal which provide a discharge path for the charges stored in the capacitive load.

Some embodiments of the present invention include a second amplifier and a second capacitive load. The second amplifier includes a first input terminal adapted to receive the detected peak voltage across the first capacitive load, and a second input terminal coupled to its output terminal. The output terminal of the second amplifier drives the second capacitive load via a second switching circuit that is responsive to a clock signal. Accordingly, the voltage across the second capacitive load is adapted to vary between the detected peak levels. The first and second capacitive loads may be capacitors.

In some embodiments, the first amplifier includes, in part, a first transistor adapted to receive the input signal; a second transistor adapted to receive the voltage developed across the first node, a first resistive load having a first terminal coupled to a first voltage supply and a second terminal coupled to a first terminal of the first transistor, a second resistive load having a first terminal coupled to the first voltage supply and a second terminal coupled to a first terminal of the second transistor, and a current source defining a sum of currents flowing through the first and second transistors. The first and second resistive loads may be resistors, formed from polysilicon, or may be transistors. The current source may be a cascode current source.

In some embodiments, the amplified difference signal is a differential signal that includes a differentially positive signal and a differentially negative signal. In such embodiments, the transconductor, includes in part, a first transistor adapted to receive the differentially positive signal, a second transistor adapted to receive the differentially negative signal, a first resistive load having a first terminal coupled to the first voltage supply and a second terminal coupled to a first terminal of the first transistor, a second resistive load having a first terminal coupled to the first voltage supply and a second terminal coupled to a terminal of the second transistor, and a current source defining a sum of currents flowing through the first and second MOS transistors. In some embodiments, each of the first and second resistive loads is an MOS transistor of a first conductivity type. The current mirror optionally includes a first transistor having a first terminal coupled to an output terminal of the transconductor, a second terminal coupled to the first node, and a third terminal coupled to the first voltage supply, and a second transistor having first and second terminals coupled to the output terminal of the transconductor, and a third terminal coupled to the first voltage supply. The current source may be a cascode current source. The first and second transistors of the current mirror may be MOS transistors of the first conductivity type, which in some exemplary embodiments is P-type.

In some embodiments, the reset signal has a programmable duration defined by N×T, wherein T is a cycle time of the input signal, and N is an integer greater than zero. The delay between successive transitions of the reset signal and the input signal may be programmable, and the clock signal has a programmable duration equal to the duration of the reset signal. The delay between successive transitions of the reset signal and the clock signal may be defined by S×T, wherein S is an integer greater than zero. The reset and clock signals are generated during different phases of the input signal.

In accordance with another embodiment of the present invention, to detect peaks level of an incoming signal, a first signal having a voltage level defined by an amplified difference of a feedback voltage signal and the voltage of the incoming signal is generated. The variations in the voltage level of the first signal are used to vary the level of a first current. The first current is used, in turn, to charge a first capacitive load to which the feedback signal is responsive. The capacitive load carries the detected peak level voltage across its terminals. The capacitive load is charged to a predefined voltage level during the reset periods. The first current may be used to mirror a current that is supplied to the capacitive load.

In some embodiments, a second voltage having a level defined by an amplified difference of a second feedback voltage signal and the first voltage is generated. The second voltage is, in turn, used to charge a second capacitive load to which the feedback signal is responsive. Accordingly, the voltage across the second capacitive load is adapted to vary between the detected peak levels and is not reset to predefined levels. The second capacitive load is responsive to a clock signal.

In some embodiments, the reset signal has a programmable duration defined by N×T, wherein T is a cycle time of the input signal, and N is an integer greater than zero. The delay between successive transitions of the reset signal and the incoming signal may be programmable, and the clock signal has a programmable duration equal to the duration of the reset signal. The delay between successive transitions of the reset signal and the clock signal may be defined by S×T, wherein S is an integer greater than zero. The reset and clock signals are generated during different phases of the input signal.

An peak detector, in accordance with another embodiment of the present invention, includes amplifying means for generating a first signal having a voltage level defined by an amplified difference of a feedback voltage and the voltage of the incoming signal, transconductor means for varying a level of a first current in response to changes in the first voltage level, charging means for charging a first capacitive load to which the feedback signal is responsive; and means for discharging the first capacitor in response to a reset signal.

Such embodiments also include means for mirroring a second current generated in a first transistor in response to the variations in the first current level; and means for supplying the mirrored current to the first capacitive load. Some embodiments also include means for switching a circuit in response to the reset signal during each reset period to discharge the first capacitive load to a predefined value. Some embodiments also include means for generating a second voltage having a level defined by an amplified difference of a second feedback voltage and the first voltage; and means for charging a second capacitive load in response to changes in the second voltage level. The second capacitive load is responsive to a clock signal.

In some embodiments, the reset signal has a programmable duration defined by N×T, wherein T is a cycle time of the input signal, and N is an integer greater than zero. The delay between successive transitions of the reset signal and the incoming signal may be programmable, and the clock signal has a programmable duration equal to the duration of the reset signal. The delay between successive transitions of the reset signal and the clock signal may be defined by S×T, wherein S is an integer greater than zero. The reset and clock signals are generated during different phases of the input signal.

DETAILED DESCRIPTION OF THE INVENTION

Figure 5:
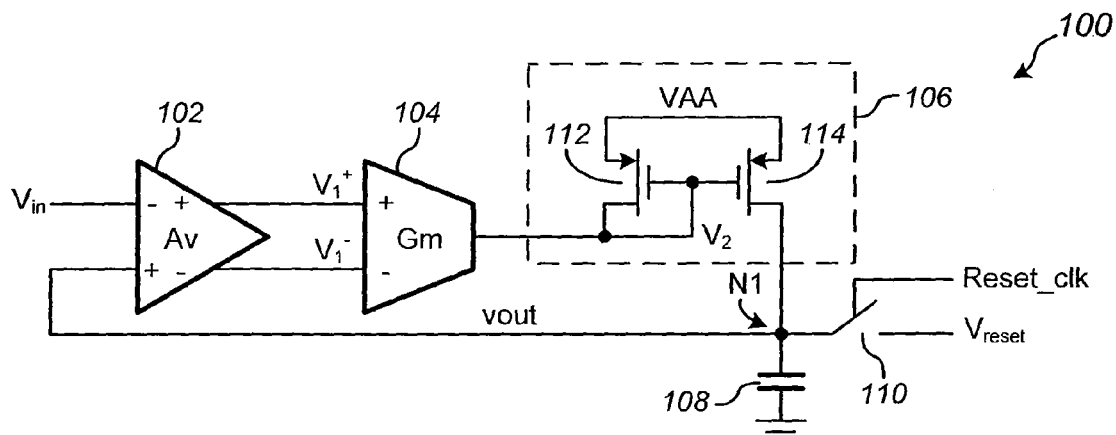
FIG. 5 is a block diagram of a peak detector, in accordance with one embodiment of the present invention.

FIG. 5 is a simplified high-level block diagram of an peak detector 100, in accordance with one embodiment of the present invention. Peak detector 100 is shown as including, in part, a differential amplifier 102, a transconductor 104, and a current mirror 106. In some embodiments, differential amplifier may have a relatively low gain and a high bandwidth, and transconductor 104 may have a medium gain and a relatively high bandwidth. As described in detail below, peak detector 100 has a substantially reduced sensitivity to temperature, fabrication process and input signal waveform as compared to known peak detectors. Peak detector 100 is adapted to be used in applications requiring high data rates, such as optical storage applications, where high data rate peaking signals need to be detected to enable optimum and/or automatic power control.

To detect the peak levels of signal Vin, switch 110 is initially closed to enable sampling capacitor 108 to be reset to voltage Vreset. Voltage Vreset is selected so as to be lower than the minimum peak value the detector is adapted to detect. After capacitor 110 is fully charged to this voltage level, switch 110 is opened. As a consequence, the difference between input voltage Vin and voltage Vout carried by node N1 is amplified by differential amplifier 102 which has a gain of Av. The amplified differential output voltages $V_1^+$, $V_1^-$ generated by amplifier 102 are supplied to transconductor 104 which, in response, generates a signal $V_2$ defined by the product of transconductance (gm) of transconductor 104 and the difference between the voltages $V_1^+$, $V_1^-$.

If voltage Vin is greater than voltage Vout, voltage $V_2$ generated by transconductor 104 is decreased, which in turn, causes PMOS transistor 114 of current mirror 106 to rapidly charge capacitor 108, thereby causing voltage Vout to increase. This is referred to as the tracing phase. If voltage Vout is slightly larger than voltage Vin, transconductor 104 causes the voltage V2 to increase, thereby shutting off transistors 112 and 114 so as to hold voltage Vout at the detected peak value. Therefore, the voltage potential at node N1, i.e., voltage Vout, is held at the peak value. This is referred to as the hold phase.

Figure 6:
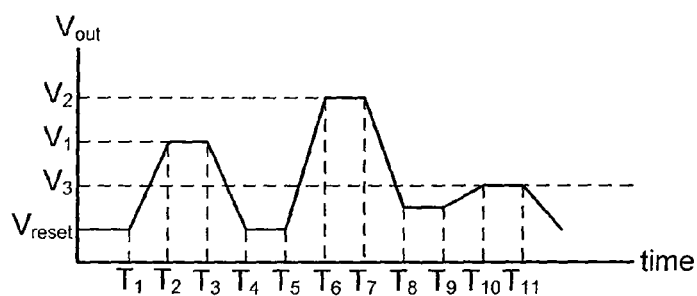
FIG. 6 is an exemplary timing diagram of the signal detected by peak detector of FIG. 5, in accordance with one embodiment of the present invention.

FIG. 6 is an exemplary timing diagram of signal Vout detected by peak detector 100. Periods (T2-T1), (T6-T5) and (T10-T9) represent tracing phases. As seen from FIG. 6, peak voltage levels V1, V2, and V3, detected respectively at time T2, T6 and T10 are held at these respective values during hold periods (T3-T2), (T7-T6) and (T11-T10) respectively. As seen from FIG. 6, after detecting each peak level, voltage Vout is reset to the voltage level Vreset.

Figure 7:
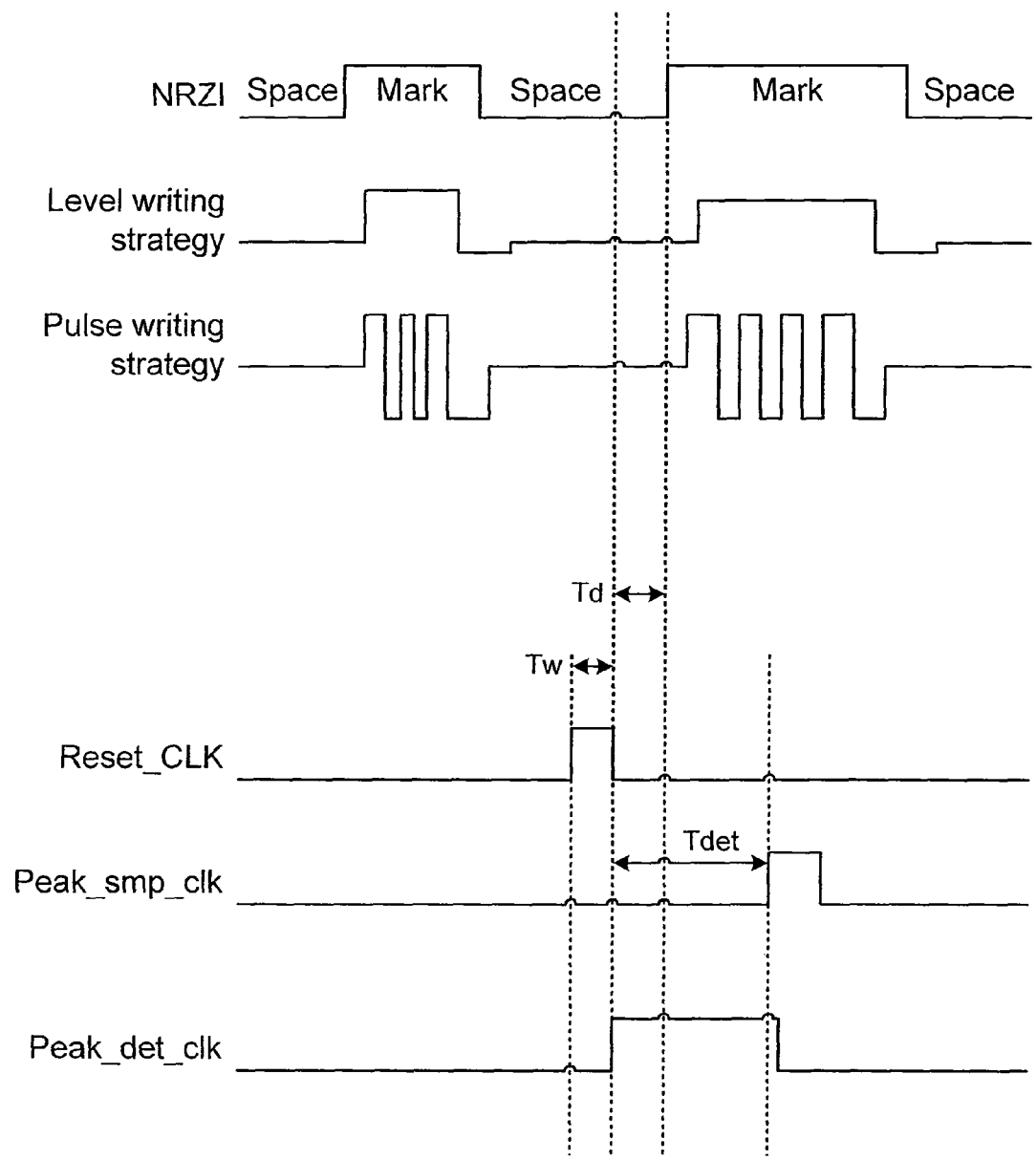
FIG. 7 shows a timing diagram of a number of reset signals, in accordance with one embodiment of the present invention.

FIG. 7 shows, in part, a timing diagram of signals reset_clk and peak_det_clk. Signal reset_clk is applied to switch 110 to reset the peak detector, as described above. In the exemplary embodiment of FIG. 7, signal peak_det_clk is shown as being initiated in response to the falling edge of signal reset_clk and terminated after a period of sufficient duration to enable the detection of at least one peak of input signal Vin. Signal peak_det_clk may be generated using a control circuitry (not shown). When signal peak_det_clk is in a first logic state, e.g., high logic state, peak detector 100 is in a tracing phase, and when signal peak_det_clk is in a second logic state, e.g., low logic state, peak detector 100 is in a hold phase. In one exemplary embodiment, signal peak_det_clk is used to enable peak detector 100 to receive input signal $V_{in}$ to detect its peak. In yet other embodiments, signal peak_det_clk is a timing signal providing peak detector 100 with sufficient time to detect the peak level of signal $V_{in}$. Transitions on signal peak_det_clk, for example, its falling transitions, are used to trigger signal peak_smp_clk.

Figure 1:
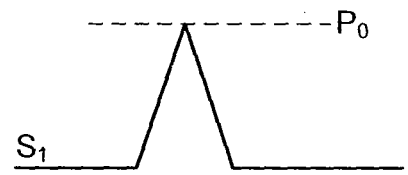
FIG. 1 is a waveform of a triangular signal, as known in the prior art.
Figure 2:
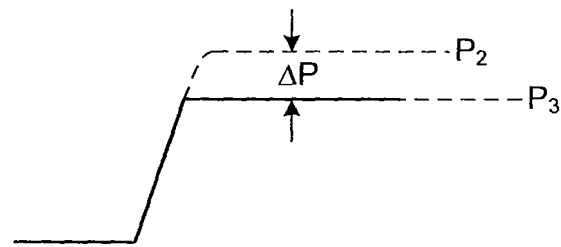
FIG. 2 is a waveform of a step signal, as known in the prior art.
Figure 3:
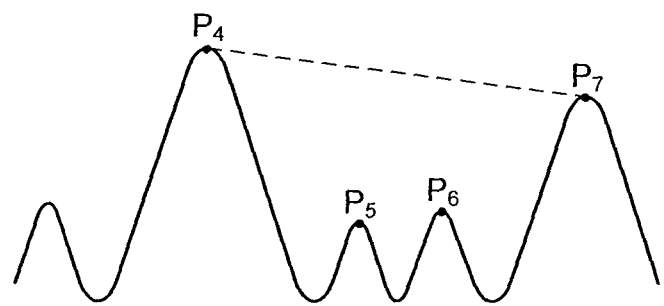
FIG. 3 is a waveform of a signal having a multitude of peaks, as known in the prior art.
Figure 4:
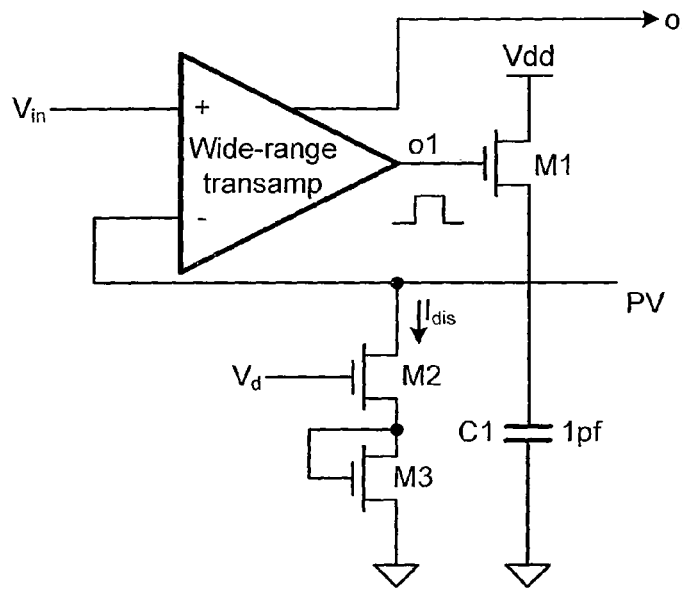
FIG. 4 is a schematic diagram of a peak detector, as known in the prior art.
Figure 8:
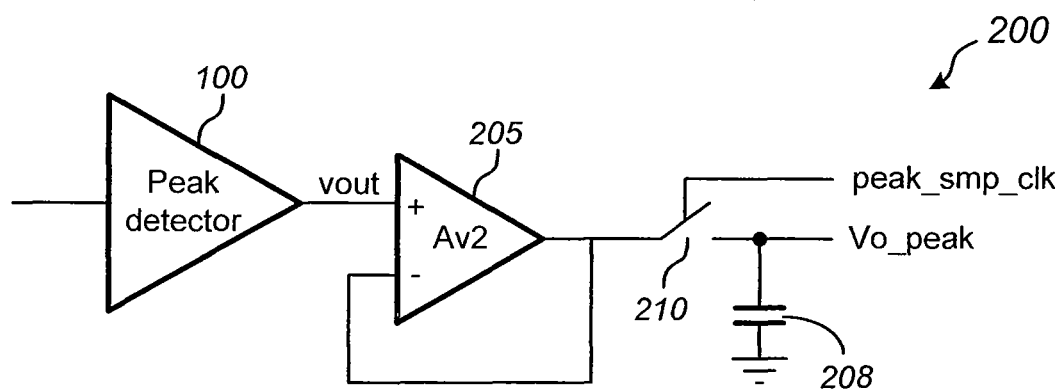
FIG. 8 is a block diagram of an envelop detector, in accordance with another embodiment of the present invention.

FIG. 8 is a simplified high-level block diagram of an envelope detector 200, in accordance with another embodiment of the present invention. Envelope detector 200 is shown as including peak detector 100, shown in FIG. 1 and described above, as well as an amplifier 205. In some embodiments, amplifier 205 is a voltage follower amplifier having an intermediate gain, e.g., greater than 40 dB, and a relatively high bandwidth.

When peak detector 100 is in the hold phase, switch 210 is closed to enable capacitor 208 to be charge to voltage level Vout. Accordingly, when switch 210 is open, capacitor 208 maintains the charges reflecting the detected peak value Vout. Consequently, voltage Vo_peak maintained across capacitor 208 represents the envelope of the detected peak levels of Vin.

Figure 9:
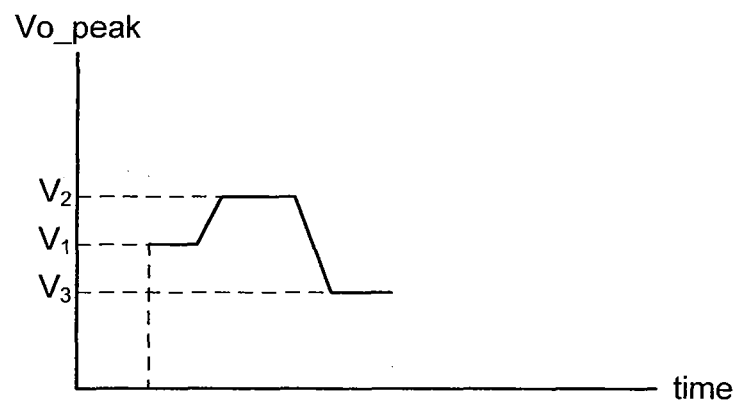
FIG. 9 is an exemplary timing diagram of the signal detected by the envelop detector of FIG. 8, in accordance with one embodiment of the present invention.

FIG. 9 is an exemplary timing diagram of signal Vo_peak generated by envelope detector 200. As is seen from FIG. 9, signal Vo_peak only varies between the peak levels of voltage Vout detected by peak detector 100 (see FIG. 6). FIG. 7 also shows a timing diagram of signal peak_smp_clk. In this exemplary diagram, a pulse appears on signal peak_smp_clk following a falling transition on signal peak_det_clk.

Figure 10:
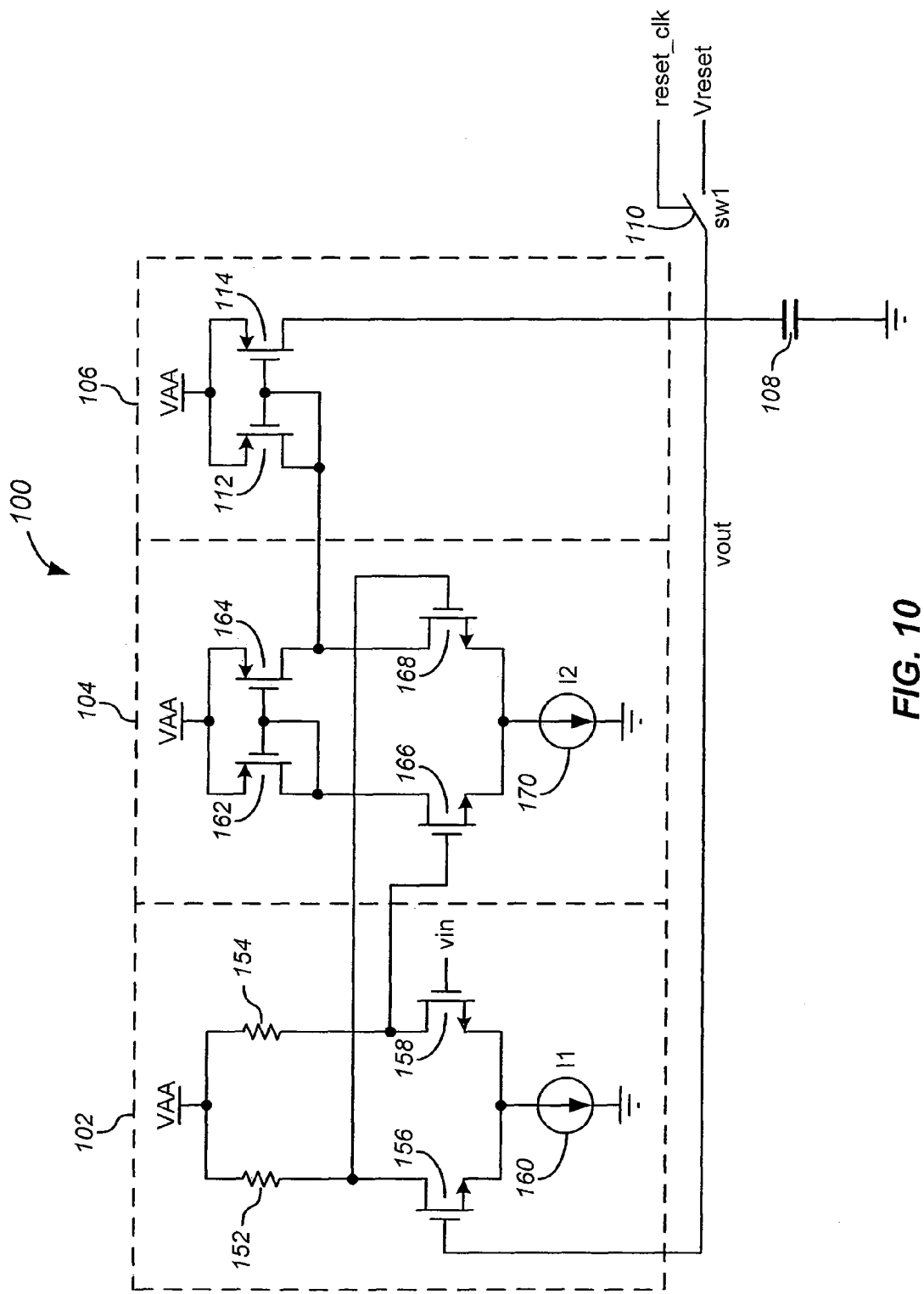
FIG. 10 is a transistor schematic diagram of the peak detector of FIG. 5, in accordance with one embodiment of the present invention.

FIG. 10 is a transistor schematic diagram of peak detector 100 shown in FIG. 5. Differential amplifier 102 is shown as including load resistors 152 and 154, input transistors 156, 158, and a current source 160. To maximize the bandwidth of peak detector 100 and maintain stability, differential amplifier 102 is selected to have a relatively high bandwidth, e.g. twice the dominant pole frequency, and also selected so as not to have a relatively high gain. Moreover, since systematic offset is inversely proportional to the DC gain, the gain of differential amplifier is selected so as not to be relatively too small. In one embodiment, a DC gain of 15-20 dB is used. Resistive loads 152 and 154 are used to minimize the loading and provide DC output common mode voltage. In one embodiment, transistors 156 and 158 have similar sizes, and resistors 152, 154 have similar resistances.

When voltage Vout reaches a peak value and the circuit is in the hold phase, the input signal change will feed into node N1 via the gate-to source parasitical capacitance (Cgs) of transistor 158 by an amount defined by the ratio of the capacitances of capacitors Cgs (not shown) and 108. Therefore, the input transistors 156 and 158 are selected to have small sizes to maintain Cgs at relatively small values. To minimize the feedthrough and maintain relatively high bandwidths capacitor 108 is selected to have a relatively large value. The output common-mode voltage of amplifier 102 is defined by:

$$V_{cm\_out} = 0.5 \times I_1 \times R_{152} \qquad (1)$$

The common-mode voltage may be varied depending on the requirements defined by the application using the envelop detector. The common-mode voltage should be selected so as not to be lower than the bandwidth appreciably. In some embodiments, resistors 152 and 154 are polysilicon resistors. In such embodiments, polysilicon resistors are also used in current source 160 to minimize temperature sensitivity. Transistors 156, 158, 162 and 164 should be selected such that loading contribution from the gate capacitances of transistors 166, 168, and drain capacitances of transistors 156, 158 is minimized. Transconductor 104 is shown as including NMOS input transistors 166, 168, and PMOS load transistors 162, 164, which form a current mirror. The sizes of transistors 166 and 168 are selected so as to minimize the loading seen by amplifier 102.

Charging circuit 106 is shown as including PMOS transistors 112 and 114. The ratio of the channel-width to channel-length of transistor 114 relative to that of transistor 112 determines the charging current value. During the tracing phase, as described above, a current flows through transistor 112, which is mirrored in transistor 114 and that charges capacitor 108. Therefore, the loading at the gate terminals of transistors 112 and 114 should be minimized to maximize the bandwidth. During the hold phase, the gate voltages of transistors 112, and 114 are raised to the supply voltage VAA.

Assume that the voltage applied to the input terminals of transistors 166, 168 are the same, representing a quiescent state, and in which case no current flows through transistor 112. Accordingly, the gate-to-source voltage of transistor 112, $V_{gs\text{-}112}$, may be expressed as following:

$$V_{gs\_112} < V_{th1} \qquad (2)$$

where $V_{th1}$ is the threshold voltage of either one of the PMOS transistors 112, 114. Any subthreshold current flowing through transistors 112, 114 drops exponentially in response to the gate-to-source voltage Vgs. This causes more charges to be stored in capacitor 108 thereby causing voltage Vout to rise. This results in systematic offset which at the input terminals of transconductor 104 may be expressed as following:

$$\Delta V = (V_{out} - V_{peak}) \times A_v \quad (3)$$

where Vpeak is the peak value and $A_v$ is the voltage gain of differential amplifier 102. At the quiescent state, the current flowing through transistors 162, and 164 is approximately defined by the following:

$$I_{166} = \frac{\beta_n}{2}(V_{gs\_166} - V_{th2})^2 \quad (4)$$

$$= \frac{\beta_n}{2} \cdot V_{dsat\_166}^2 \quad (5)$$

$$= \frac{I_2}{2} \quad (6)$$

Where β is a parameter related to the process and size of the NMOS transistors 166, 168, and $V_{th2}$ is the threshold voltage of any of the NMOS transistors. In order to substantially absorb the tail current I2, the current flowing through transistor 166 may be defined as shown below:

$$I'_{166} = I_2 \quad (7)$$

$$= \frac{\beta_n}{2}(\sqrt{2}\, V_{dsat\_166})^2 \quad (8)$$

$$= \frac{\beta_n}{2}(V'_{gs\_166} - V_{th\_166})^2 \quad (9)$$

Ignoring the body effects, the following is obtained:

$$V'_{gs\_166} = V_{gs\_166} + 0.414 \times V_{dsat\_166} \quad (10)$$

Accordingly, the difference at the input terminals of transconductor 104 may be defined as shown below:

$$\Delta V = 0.414 \times V_{dsat\_166} \quad (11)$$

Combining equations (3) and (11) the systematic offset is approximately defined by the following:

$$V_{sys\_os} = \frac{0.414}{A_v} \times V_{dsat\_166} \quad (12)$$

The systematic offset reaches its maximum value, described in accordance with equation (12), when the input signal has a relatively long and flat duration after reaching its peak. For a signal falling relatively quickly shortly after reaching its peak, the systematic offset is less because the input signal drop effectively adds negative offset to cancel the systematic offset. Therefore, systematic offset is waveform dependent. In order to achieve input signal waveform insensitivity, the systematic offset should be minimized. In accordance with the present invention, the systematic offset is reduced by the gain of the differential amplifier 102, thereby to minimize waveform sensitivity. Current level I2 supplied by current source 170 is selected such that both the $V_{dsat}$ of transistor 166, i.e., $V_{dsat\_166}$ as well as the transconductance supplied by transconductor 104 have proper values.

Two types of write techniques, namely level writing and pulse writing, are used in an optical storage system. FIG. 7 shows exemplary laser signal waveforms for these two types of write techniques. During write operations, the peak power level is represented by the peak signal level. In an optical storage system, run length limited NRZI encoded data is written to and read from the optical disk. In some systems, such as DVD systems, the minimum length of space and mark phases for such NRZI data, is, for example, 3T, and the maximum length of space and mark phases is, for example, 14T, where T is the data rate cycle time.

As shown in FIG. 7, the peak power level to be detected occurs within the mark phases of the data. Signal reset_clk is generated during the space phases and signal peak_smp_clk is generated during the mark phases of the data. In accordance with the present invention, programmable delays and pulses associated with the NRZI data are used to generate signals reset_clk and peak_smp_clk enabling these signals to have optimal positions relative to the peak power level.

Signal reset_clk, generated in accordance with the NRZI data, has a pulse width, Tw, that is programmable. For example, Tw may be equal to N×T, where N is an integer, varying in some embodiments from, for example, 1-2. The delay between, for example, the falling edge of signal reset_clk and, for example, the rising edge of a subsequent mark, is also programmable. The generation of various pulses may also be made dependent on the duration of the space phases. For example, a pulse may only be generated if the duration of the space phase, is greater than M×T, where M is an integer ranging, for example, from 3-8.

Signal peak_smp_clk is a delayed replica of signal reset_clk and is shown as having a delay of Tdet with respect to signal reset_clk. Delay Tdet is also programmable. For example, Tdet may be equal to P×T, where P is an integer ranging, for example, from 1-5. Signal peak_smp_clk may also be dependent on the duration of the mark phases. For example, a pulse on signal peak_det_clk may be generated only if an associated mark phase exceeds Q×T, where Q is an integer ranging, for example, from 3-8. Signal peak_det_clk is generated using signals reset_clk and peak_smp_clk.

The above timing programmability provides flexibility to generate peak detection clocks reset_clk, peak_det_clk and peak_smp_clk according to the NRZI data pattern, so that the peak power level can be detected from, for example, all or a subset of the data patterns. The above timing programmability is used to adjust the relationship between the peak detection clocks and the NRZI data. However, the signal to be peak detected may have additional delays caused by, for example, logic gates, on-board traces, laser drivers, laser diodes, delays associated with the optical paths, photo detectors, etc. To cancel such delays, additional programmable timing adjustments, collectively referred to as Tgroup (not shown), may be made. In some embodiments, Tgroup may be adjusted to have a value defined by S×T, where S is an integer ranging, for example, from 0-64. Delay Tgroup is added to the delays Td and Tdet to generate signals reset_clk and peak_smp_clk for the associated space/mark phases, and to optimally position these two signals relative to the space/mark phase of the read back signal during write operations.

Table I below shows exemplary numerical values of some of the characteristics of the envelop detector of the present invention, obtained partly by using computer simulations.

TABLE I

| | |
|---|---|
| Power consumption | 3.3 V * 840 uA |
| Differential amplifier gain-bandwidth | 7.7 × 4.6 GHz |
| gain-bandwidth | 35.4 × 1.05 GHz |
| Temperature sensitivity | ±1 mV |
| Process and temperature sensitivity | ±4 mV (worst case) |
| Waveform sensitivity | ±4 mV |
| Minimum detectable peak difference | 0.1 mV |
| Maximum detectable rising edge slope | $2.67 \times 10^8$ V/s |

Figure 11A:
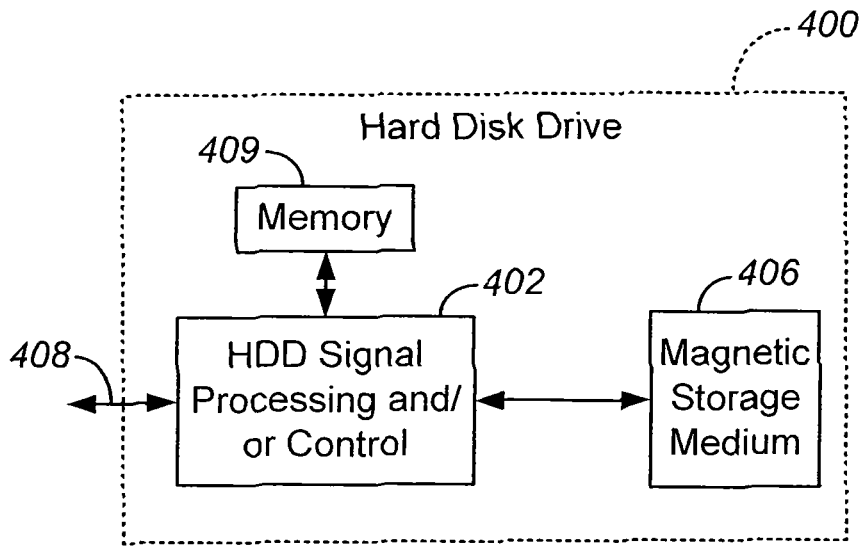
FIGS. 11A-11H show various devices in which the present invention may be embodied.

Referring now to FIGS. 11A-11G, various exemplary implementations of the present invention are shown. Referring to FIG. 11A, the present invention may be embodied in a hard disk drive 1000. The present invention may implement either or both signal processing and/or control circuits, which are generally identified in FIG. 11A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 11B:
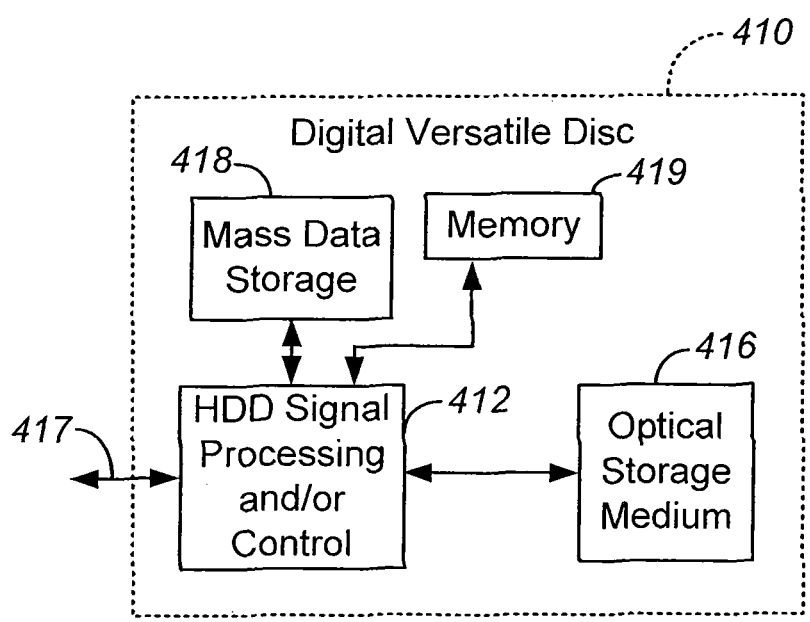

Referring now to FIG. 11B, the present invention may be embodied in a digital versatile disc (DVD) drive 1010. The present invention may implement either or both signal processing and/or control circuits, which are generally identified in FIG. 11B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 11A. The HDD may be a mini HDD that includes one or more platters having a diameter that is smaller than approximately 1.8". DVD 1010 may be connected to memory 1019, such as RAM, ROM, low latency nonvolatile memory such as flash memory, and/or other suitable electronic data storage.

Figure 11C:
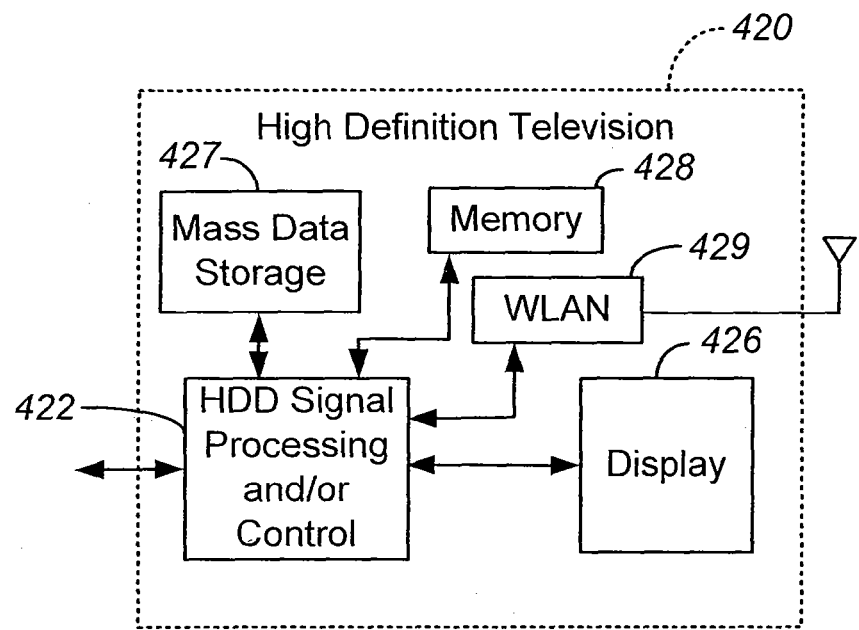

Referring now to FIG. 11C, the present invention may be embodied in a high definition television (HDTV) 1020. The present invention may implement either or both signal processing and/or control circuits, which are generally identified in FIG. 11C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Figure 11D:
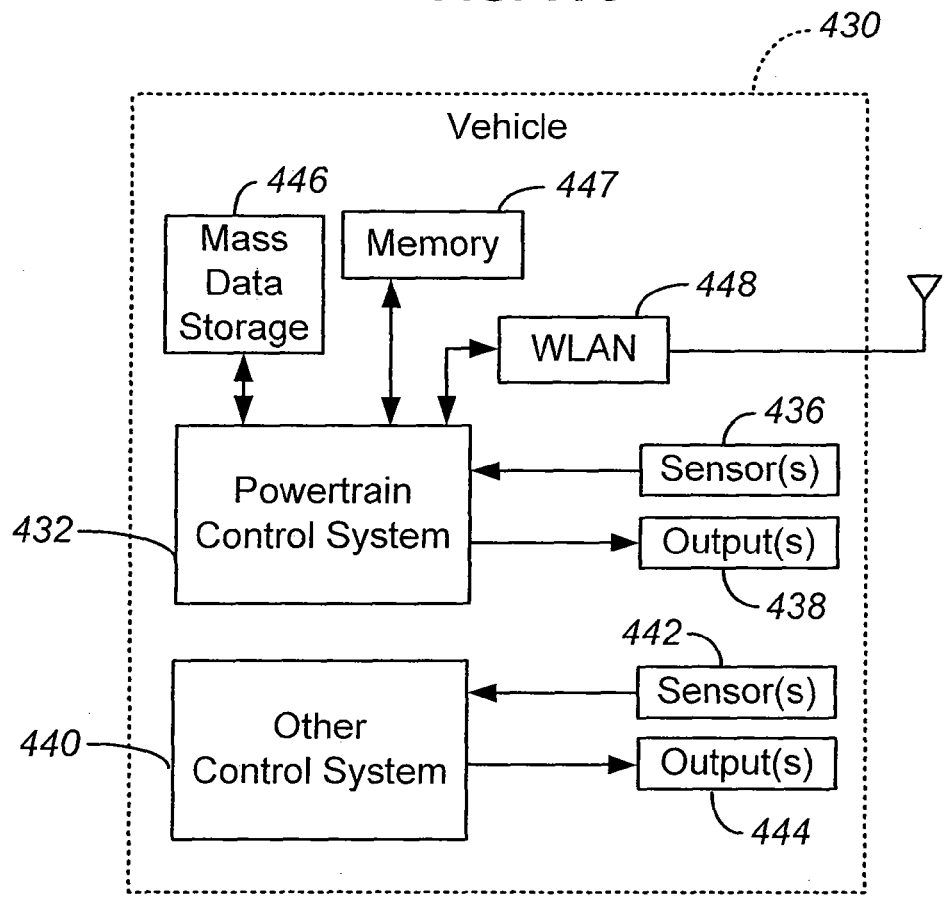

Referring now to FIG. 11D, the present invention implements a control system of a vehicle 1030, a WLAN interface and/or mass data storage of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 11E:
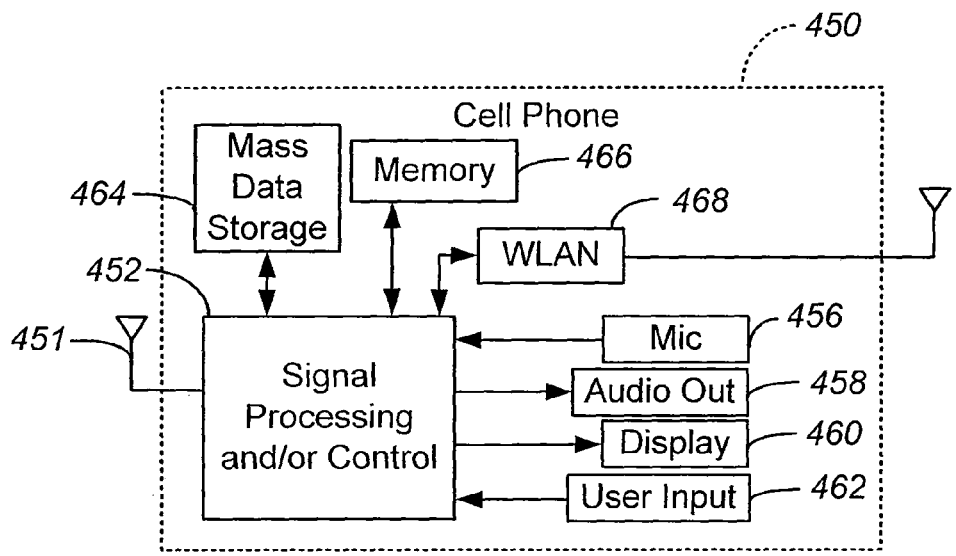

Referring now to FIG. 11E, the present invention may be embodied in a cellular phone 1050 that may include a cellular antenna 1051. The present invention may implement either or both signal processing and/or control circuits, which are generally identified in FIG. 11E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 11F:
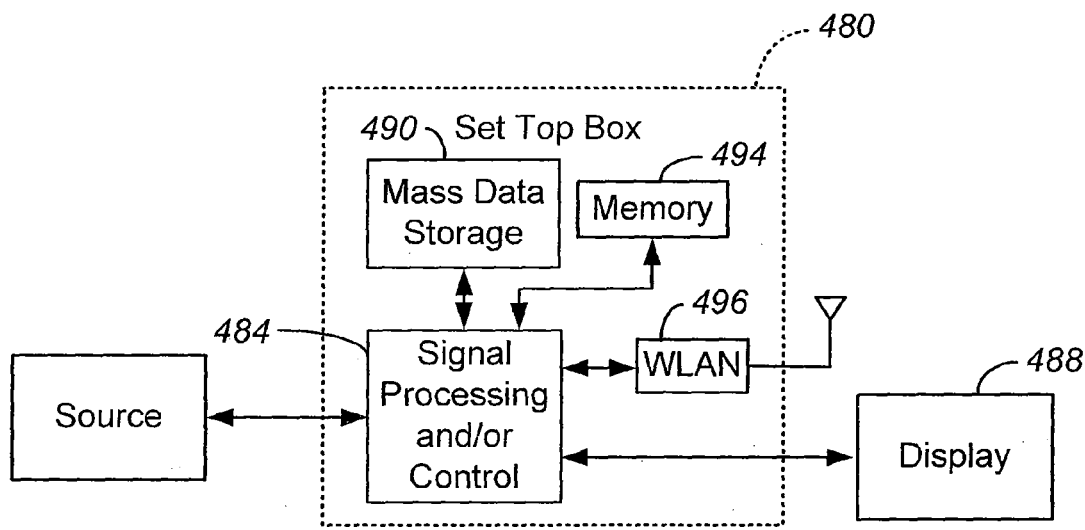

Referring now to FIG. 11F, the present invention may be embodied in a set top box 1080. The present invention may implement either or both signal processing and/or control circuits, which are generally identified in FIG. 11F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 11G:
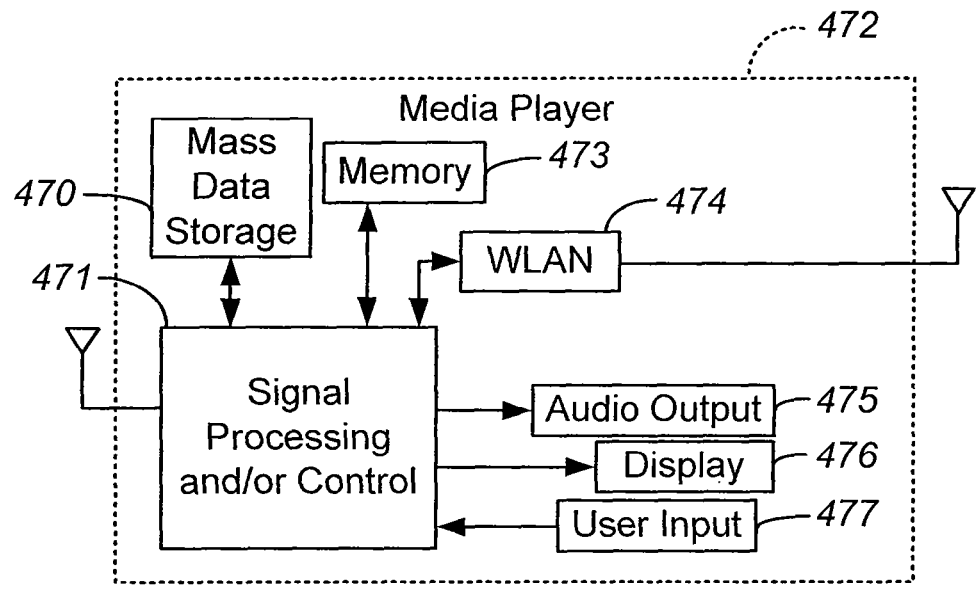

Referring now to FIG. 11G, the present invention may be embodied in a media player 1072. The present invention may implement either or both signal processing and/or control circuits, which are generally identified in FIG. 11G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 11H:
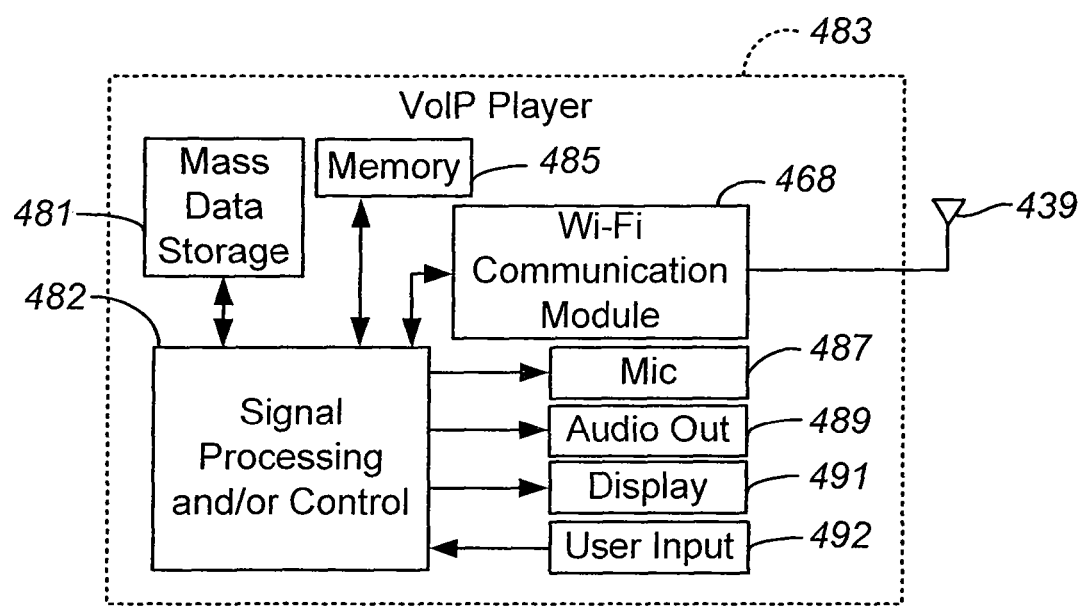

Referring to FIG. 11H, the present invention may be embodied in a Voice over Internet Protocol (VoIP) phone 1083 that may include an antenna 1039. The present invention may implement either or both signal processing and/or control circuits, which are generally identified in FIG. 11H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

The above embodiments of the present invention are illustrative and not limitative. Various alternatives and equivalents are possible. The invention is not limited by the type of amplifier, transconductor, current mirror, etc used. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

The invention claimed is:

1. A method of detecting one or more peak levels of an incoming signal, the method comprising:
   differentially amplifying the incoming signal and a feedback signal to generate an amplified differential signal representing one or more amplified differences between the incoming signal and the feedback signal;
   charging and discharging a capacitive load over a plurality of charging periods and associated discharging periods, wherein for each of the plurality of charging periods and associated discharging periods,
      charging the capacitive load is based on the one or more amplified differences and charging to one of one or more levels, each of the one or more levels identifying one of the one or more peak levels of the incoming signal; and
      discharging the capacitive load is from the one of the one or more levels to one of one or more reset levels, each of the one or more reset levels being lower than a minimum peak level of the one or more peak levels of the incoming signal, wherein discharging the capacitive load is responsive to a reset signal, the reset signal having a programmable duration based on N×T, wherein T is a cycle time of the incoming signal and N is an integer greater than zero, and wherein the capacitive load is in communication with the feedback signal.

2. The method of claim 1 wherein the one or more reset levels are higher than ground.

3. The method of claim 1 wherein the capacitive load is a first capacitive load, the feedback signal is a first feedback signal, and the amplified difference is a first amplified difference, the method further comprising:

differentially amplifying a voltage signal of the first capacitive load and a second feedback signal to generate a second amplified difference; and charging a second capacitive load to the one or more levels indicative of at least one of the one or more peak levels in response to the second amplified difference, wherein the second capacitive load is in communication with the second feedback signal.

4. The method of claim 3 wherein the second capacitive load is responsive to a clock signal.

5. The method of claim 4 wherein the clock signal has a programmable duration equal to a duration of the reset signal.

6. The method of claim 4 wherein a delay between successive transitions of the reset signal and the clock signal is defined by S×T, wherein S is an integer greater than zero and T is a cycle time of the incoming signal.

7. A high-speed optical storage system that generates an output signal based on encoded data, the output signal including a detected peak level of the encoded data, the system comprising:

a laser configured to generate an input signal indicative of one or more peak levels of the encoded data; and a circuit that comprises:

an amplifier configured to generate an amplified differential signal representing one or more amplified differences between the input signal and a feedback signal; and a capacitance in communication with the feedback signal, wherein for each of a plurality of charging periods and associated discharging periods of the capacitance, the capacitance is configured to be:

charged to one of one or more levels based on the one or more amplified differences, each of the one or more levels identifying one of the one or more peaks levels; and discharged from the one of the one or more levels to one of one or more reset levels, each of the one or more reset levels being lower than a minimum peak level of the one or more peak levels of the encoded data, wherein the discharge of the capacitance is responsive to a reset signal, the reset signal having a programmable duration based on N×T, wherein T is a cycle time of the incoming signal and N is an integer greater than zero, wherein the amplifier is responsive to the charge across the capacitance.

8. The system of claim 7 wherein the circuit further comprises: a switching circuit responsive to the reset signal and configured to provide a discharge path for the charge stored in the capacitance.

9. The system of claim 8 wherein each of the one or more reset levels is higher than ground.

10. The system of claim 8 wherein the amplifier is a first amplifier and the capacitance is a first capacitance, the circuit further comprising:

a second amplifier in communication with the first capacitance; and a second capacitance responsive to the second amplifier and to a clock signal.

11. The system of claim 10 wherein a delay between successive transitions of the reset signal and the clock signal is defined by S×T, wherein S is an integer greater than zero and T is a cycle time of the input signal.

12. The system of claim 10 wherein the reset and clock signals are generated during different phases of the input signal.

13. The system of claim 7 wherein the amplifier of the circuit comprises:

a first transistor to receive the input signal;

a second transistor to receive the feedback signal;

a first resistive load in communication with a voltage supply and the first transistor;

a second resistive load in communication with the voltage supply and the second transistor; and a current source defining a sum of currents flowing through the first and second transistors.

14. The system of claim 7 wherein the output of the amplifier comprises a differentially positive signal and a differentially negative signal and the system further comprises a transconductor responsive to the output of the amplifier, the transconductor comprising:

a first transistor to receive the differentially positive signal;

a second transistor to receive the differentially negative signal;

a first resistive load in communication with a voltage supply and the first transistor;

a second resistive load in communication with the voltage supply and the second transistor; and a current source defining a sum of currents flowing through the first and second transistors.

15. The system of claim 7 wherein the circuit further comprises a current mirror configured to supply a charging current to the capacitance, the current mirror comprising:

a first transistor in communication with a transconductor and a voltage supply; and a second transistor in communication with the transconductor and the capacitance.

16. The method of claim 1 further comprising generating a current based on the amplified differential signal, wherein charging the capacitive load is based on the current.

17. The method of claim 1, further comprising: receiving the reset signal to lower the capacitive load to one of the one or more reset levels for the programmable duration during each of the plurality of discharging periods.

18. The method of claim 1, wherein the incoming signal comprises encoded data having mark phases and space phases, and wherein the method further comprises:

detecting the one or more peak levels of the incoming signal during the mark phases; and discharging the capacitive load during the space phases.

19. The system of claim 7, wherein the encoded data comprises mark phases and space phases, wherein the capacitance is configured to be charged so that the charge across the capacitor is at the one of the one or more peak levels at mark phases, and wherein the capacitance is configured to be discharged during the space phases.

\* \* \* \* \*